May 22, 1956 H. H. NAIDICH 2,747,097

LOCKED-IN FREQUENCY MULTIPLIER

Filed Sept. 26, 1952

HERBERT H. NAIDICH
*INVENTOR.*

*BY*

Killman, Kerst and Pfund
ATTORNEYS 2,747,097
Patented May 22, 1956

2,747,097

LOCKED-IN FREQUENCY MULTIPLIER

Herbert H. Naidich, Baltimore, Md., assignor to Bendix Aviation Corporation, Towson, Md., a corporation of Delaware Application September 26, 1952, Serial No. 311,756

8 Claims. (Cl. 250—36)

This invention relates generally to electrical circuits used to maintain a correspondence between two independent signals and more particularly to such circuits for signals having other than one-to-one correspondence.

The present invention finds particular application in ground controlled approach (GCA) systems and such other systems as require a generation of a multiple pulse waveform relative to a reference wave. The invention is thus not limited in application but is of general utility.

An object of the present invention is to provide a circuit for a controlled relation between the number of input and output repetitive signals which is maintained over a wide range of deviation of the input frequency.

A further object is to provide a doubled or other multiple pulse output which is controlled in relation to an input pulse frequency but need not be in time coincidence therewith.

Another object is to provide a pulse multiplying circuit which includes features of simplicity and reliability of operation with wide variations in frequency of the reference signal.

These and other objects of the invention are accomplished by providing a pulse generator having a repetition period near that required for the desired multiple frequency pulse output and controlled by an applied potential. This pulse output generates a waveform which is employed for phase comparison with the reference signal input. The voltage obtained by phase comparison is utilized as a control potential for the multiple pulse generator.

The invention may be better understood from the following detailed description taken in conjunction with the accompanying drawings wherein.

Figures 1, 2:
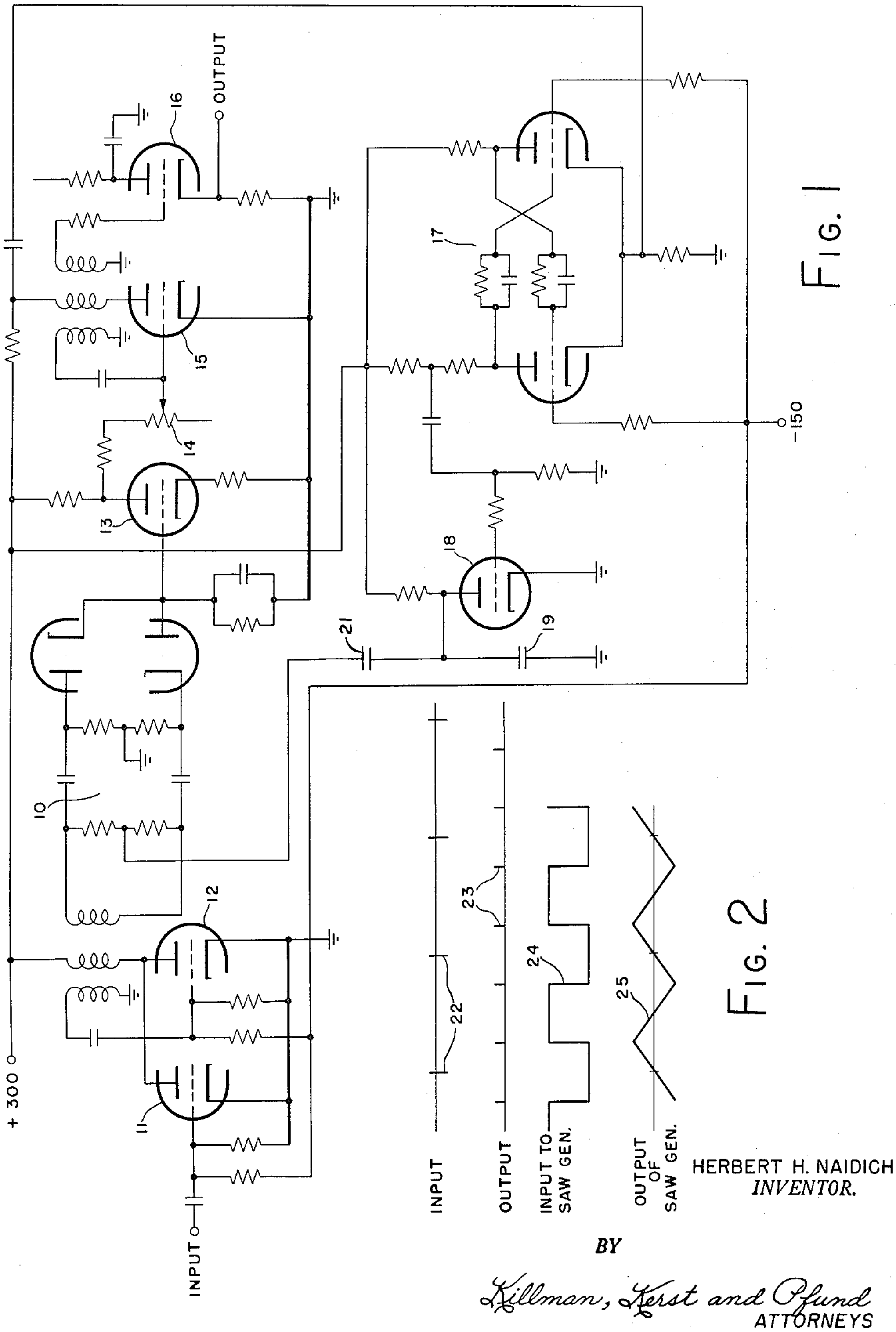
Fig. 1 shows a circuit according to one form of the invention.
Fig. 2 is a diagram of the operating waveforms of the circuit of Fig. 1.

In the embodiment of Fig. 1 a triode 11 is supplied from the reference frequency source and acts to trigger a blocking oscillator 12 for producing a narrow sampling pulse for each recurrence of some characteristic of the input voltage. The sampling pulse is applied to a phase detector 10 which will be more fully described hereinafter and the output voltage thereof is applied to the input of a D. C. amplifier 13. The plate voltage level of the amplifier 13 is applied through a variable resistor 14 to the grid circuit of a voltage controlled blocking oscillator 15. The oscillator 15 has a free-running recurrence frequency near the desired doubled repetition rate relative to the repetition rate of the input signal. Pulses generated by the oscillator 15 are supplied to an output circuit via a cathode follower 16.

The pulses from the oscillator 15 are applied to a count-down bistable multivibrator 17 by coupling to the common cathode circuit thereof. The action of the pulse signals so coupled is to alternate conduction between opposite sides of the multivibrator 17 for each pulse. One plate of the multivibrator is coupled to a sawtooth wave generator 18 which has an output condenser 19 and may provide approximately equal charging and discharging time constants. Charging and discharging occurs in the condenser 19 as the generator tube 18 is non-conducting or conducting, respectively, in response to the existing stable state of the multivibrator 17. The sawtooth wave generated across the condenser 19 is coupled through a condenser 21 to a midpoint of the input circuit of the phase detector 10.

The operation of the circuit of Fig. 1 will be described with reference to Fig. 2. The signal applied to the input circuit of the triode 11 includes component pulses 22 which define a time reference at the instant they have the required characteristics to trigger the oscillator 12. The oscillator 15 generates pulses 23 which are required to be double in number and, for example, in a desired out-of-phase relation with the pulses 22. Pulses 23 are transferred to the output circuit by the cathode follower 16 and are used to alternate the stable state of the multivibrator 17 thus producing a squarewave 24 in one of the plate circuits thereof. The squarewave 24 is used to effect charging and discharging of the condenser 19 to produce a triangular wave 25 thereacross. In the operation of the phase detector circuit 10, the pulses 22 act to sample the wave 25 in a known manner. For the condition shown in Fig. 2 pulses 22 occur at the point where the positive slope portion of wave 25 crosses the zero axis, corresponding to normal equilibrium operation. The output voltage of the phase detector 10 establishes the operating potential for the oscillator 15 for this condition. For variations in the recurrence period of the pulses 22 the operating potential will increase or decrease, depending on whether the pulses 22 fall on a portion of the wave 25 below or above the zero axis; the change corrects the recurrence period of the oscillator 15 to correspond to one-half that of oscillator 12.

The circuit of the present invention is useful over a wide range of input frequencies. An initial adjustment of the time constant of the blocking circuit of oscillator 15 may be made by means of adjustable resistor 14. This adjustment, together with the proper selection of a quiescent operating level for the tube 13, permits the selection of a free-running frequency for the oscillator 15 near the center of the frequency range of interest. The automatic operation of the circuit heretofore described then maintains the desired double frequency relation over a wide range of input frequencies.

Obviously, the invention is not limited to the specific embodiment shown. For example, other forms of count-down circuit than multivibrator 17 may be employed and other than a two-to-one ratio between input and output circuits may be obtained by inserting a count-down circuit having the desired ratio. Furthermore, the phase comparison of the reference signal and the generated signal after count-down may be made in other well known ways. For example, if the reference signal were sinusoidal it could be applied to the phase detector 10 directly as the sloping waveform similar to wave 25. The sub-multiple signal 24 of the generated signal 23 could then be operated upon to obtain suitable sampling pulses to apply to the other input circuit of the phase detector 10. A control voltage derived in this manner may be employed to stabilize the generator 15 in the same manner hereinbefore described.

What is claimed is:

1. A tracking pulse doubler for providing a pulse signal train of double the frequency of a reference pulse signal train, said reference train being subject to variations in recurrence frequency comprising, a phase detector having a first input circuit, a second input circuit, and rectifiers for receiving from said first input circuit opposed polarity signals and from said second input circuit like polarity signals and an output circuit, a pulse generator having a control voltage terminal for controlling the frequency thereof, means for applying to said terminal a control potential derived from said output circuit, means for providing the free-running frequency of said generator approximately equal to said double frequency, a bistable multivibrator triggered by said double frequency pulses, means coupled to said multivibrator for generating a saw-tooth waveform, a circuit coupling said saw-tooth waveform to said second input circuit, and means for energizing said first input circuit from said reference pulse signals.

2. The doubler circuit according to claim 1 in which said means for applying said control potential to said terminal includes a direct coupled amplifier for signals from said output circuit and having a connection between the output electrode thereof and said terminal.

3. The doubler circuit according to claim 1 in which said pulse generator and said means for applying a control potential comprise, a voltage controlled blocking oscillator and a direct coupled amplifier for signals from said output circuit respectively, the blocking time constant circuit of said oscillator being returned to the output electrode of said amplifier for frequency control relation in accordance to the potential of said electrode.

4. The device according to claim 3 and including an adjustable component in said time constant circuit.

5. A circuit for generating a wave train the frequency of which is an integral multiple of the frequency of a reference timing wave, said reference wave being subject to variations in recurrence frequency, comprising: a generator controllable by a variable control potential and capable of generating said wave train when the magnitude of said control potential reaches a predetermined level; a count-down circuit responsive to a signal wave having the frequency of said wave train to provide an output signal the frequency of which is equal to said frequency of said reference wave; means coupled to the output of said count-down circuit for generating a saw-tooth wave train equal in frequency to said output of said count-down circuit; a phase detector comprising a first input circuit, a second input circuit and a pair of rectifiers; said rectifiers receiving oppositely polarized signals from said first input circuit and like polarized signals from said second input circuit; means for applying said saw-tooth wave train to said second input circuit of said detector; means for applying said reference wave to said first input circuit; said phase detector producing a voltage the magnitude of which is a function of the phase difference between said input signals; and means for supplying said voltage from said detector to said generator as said control potential to maintain said wave train.

6. The circuit according to claim 5 in which said means for supplying said voltage from said detector to said generator as said control potential includes a direct coupled amplifier.

7. The circuit according to claim 5 in which said generator and said means for applying said control potential comprise a voltage controlled blocking oscillator and a direct coupled amplifier, the blocking time constant circuit of said oscillator being returned to the output terminal of said amplifier.

8. The circuit according to claim 7 including an ajustable component in the time constant circuit.

References Cited in the file of this patent

UNITED STATES PATENTS 2,459,699 Hallmark -------------- Jan. 18, 1949